United States Patent
Yamada et al.

(10) Patent No.: US 7,172,963 B2
(45) Date of Patent: Feb. 6, 2007

(54) MANUFACTURING METHOD OF SEMICONDUCTOR INTEGRATED CIRCUIT DEVICE THAT INCLUDES CHEMICALLY AND MECHANICALLY POLISHING TWO CONDUCTIVE LAYERS USING TWO POLISHING PADS THAT HAVE DIFFERENT PROPERTIES

(75) Inventors: Yohei Yamada, Kodaira (JP); Nobuhiro Konishi, Ome (JP)

(73) Assignee: Renesas Technology Corp., Tokyo (JP)

( * ) Notice: Subject to any disclaimer, the term of this patent is extended or adjusted under 35 U.S.C. 154(b) by 203 days.

(21) Appl. No.: 10/863,776

(22) Filed: Jun. 9, 2004

(65) Prior Publication Data
US 2005/0003670 A1 Jan. 6, 2005

(30) Foreign Application Priority Data
Jul. 4, 2003 (JP) ............................. 2003-191730

(51) Int. Cl.
*H01L 21/4763* (2006.01)
(52) U.S. Cl. ............... 438/626; 438/633; 438/645; 438/687; 438/692
(58) Field of Classification Search ............... 438/645
See application file for complete search history.

(56) References Cited

U.S. PATENT DOCUMENTS 6,204,169 B1 * 3/2001 Bajaj et al. ............... 438/645
6,858,540 B2 * 2/2005 Sun et al. ............... 438/693
6,960,521 B2 * 11/2005 Moon et al. ............... 438/633
2001/0055880 A1 * 12/2001 Li et al. ............... 438/690
2002/0193051 A1 * 12/2002 Homma et al. ............... 451/41
2003/0181050 A1 * 9/2003 Hu et al. ............... 438/694

FOREIGN PATENT DOCUMENTS

| JP | 8-195435 | 7/1996 |
| JP | 2001-358101 | 12/2001 |
| JP | 2002-75932 | 3/2002 |

\* cited by examiner

*Primary Examiner*—Stephen W. Smoot
(74) *Attorney, Agent, or Firm*—Reed Smith LLP; Stanley P. Fisher, Esq.; Juan Carlos A. Marquez, Esq.

(57) ABSTRACT

In the forming process of buried wirings by filling wiring trenches formed in an insulator with a conductive film mainly made of Cu, the buried wirings are formed to have a uniform-height regardless of the width and density of the wiring trenches. When polishing a barrier conductor film comprised of a Ta film in the CMP process for forming the buried wirings, the polishing agent, which controls the removal rate of the underlying insulator of a silicon oxide film relative to the barrier conductor film to almost one twentieth or less, is used as the slurry, and the pad which is made of polyurethane with a hardness of 75 degrees or more measured by the Type E durometer in conformity with the JIS K6253 and which is comprised of the foam including non-uniform pores with a diameter of about 150 μm or larger and a density of about 0.4–0.16 g/cm³, is used as the polishing pad.

16 Claims, 13 Drawing Sheets

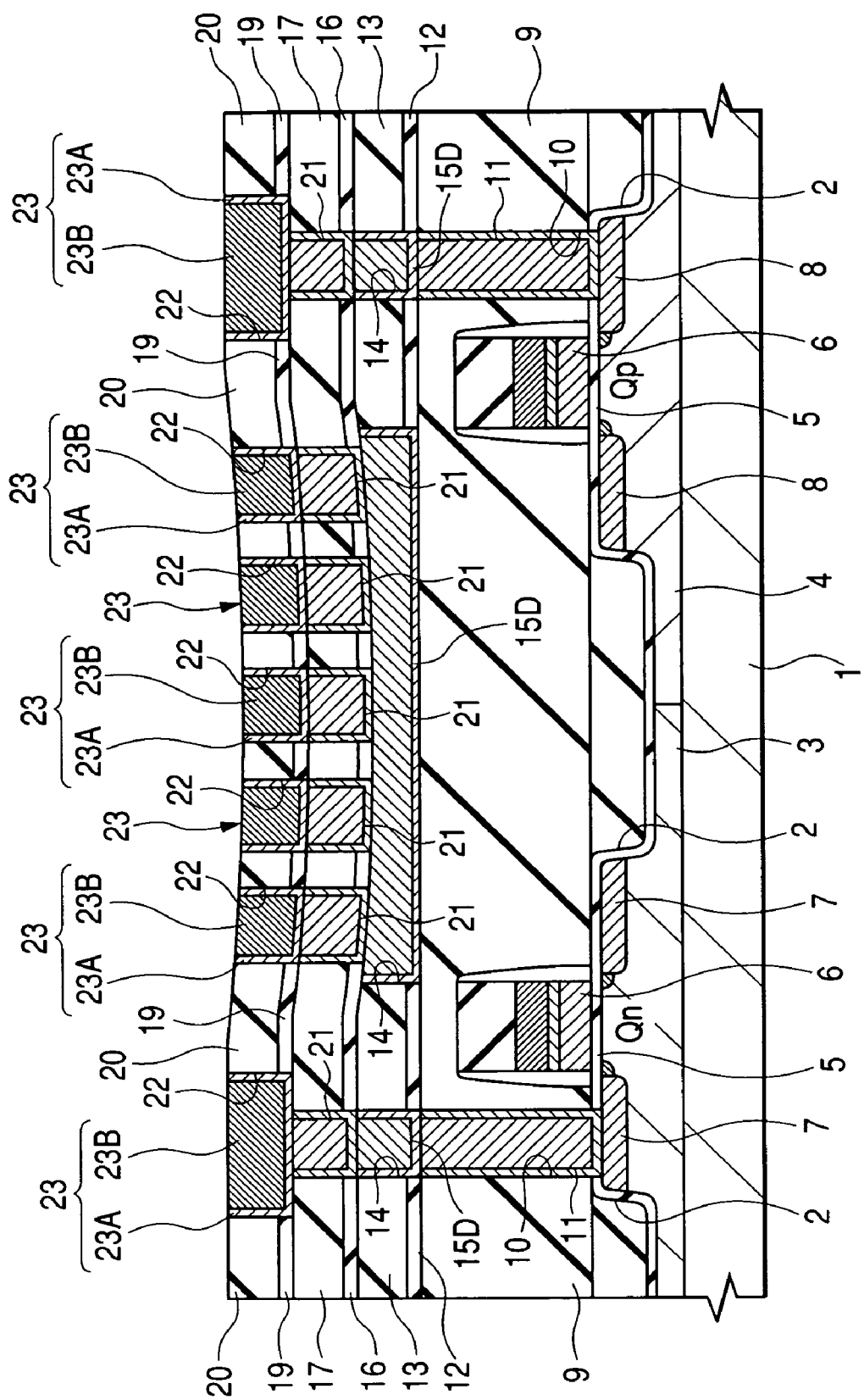

MANUFACTURING METHOD OF SEMICONDUCTOR INTEGRATED CIRCUIT DEVICE THAT INCLUDES CHEMICALLY AND MECHANICALLY POLISHING TWO CONDUCTIVE LAYERS USING TWO POLISHING PADS THAT HAVE DIFFERENT PROPERTIES

CROSS-REFERENCE TO RELATED APPLICATION

The present application claims priority from Japanese Patent Application No. JP 2003-191730 filed on Jul. 4, 2003, the content of which is hereby incorporated by reference into this application.

TECHNICAL FIELD OF THE INVENTION

The present invention relates to a manufacturing method of a semiconductor integrated circuit device. More particularly, the present invention relates to a technique effectively applied to the manufacture of the semiconductor integrated circuit device having the wirings formed in the following manner: that is, after depositing a conductive film mainly containing copper in the trenches formed in an insulator, the conductive film outside the trenches is removed by the CMP (Chemical Mechanical Polishing).

BACKGROUND OF THE INVENTION

For example, a technique for reducing the dishing and thinning when the CMP is used to form the metal wiring and the STI (Shallow Trench Isolation) is disclosed in Japanese Patent Laid-Open No. 2002-75932. This technique is characterized in that the polishing pad used in the CMP for planarizing the semiconductor substrate (referred to as substrate hereinafter) includes the polishing pad forming the composite structure with the hydrophilic and water-insoluble polymer and satisfying at least one of the requirements of: (a) the bending elastic modulus is 2 GPa or higher; and (b) the surface hardness is 80 or more of the durometer D hardness.

Also, the technique for preventing the dishing of the metal wiring is disclosed in Japanese Patent Laid-Open No. 2001-358101. This technique is characterized in that the polishing pad used to mechanically planarize the surface of the insulator or that of the metal wiring formed on the substrate satisfies the following conditions: the micro-rubber hardness A is at least 80 degrees; the number of closed cells is in the range of 150/mm$^2$ to 2500/mm$^2$; the density is in the range of 0.6 g/cm$^3$ to 0.95 g/cm$^3$; and the equilibrium water-absorption ratio is 5% or more.

Also, the technique for obtaining the transistor isolation with excellent flatness is disclosed in Japanese Patent Laid-Open No. 8-195435. This technique is characterized in that the polishing liquid obtained by adding alcohol-based amine to coloidal silica to dilute the coloidal silica so that the concentration of the alcohol-based amine is set within the range of 1 to 2% and the polishing cloth with the JIS standard hardness of 85 or more are used, the substrate is polished while maintaining the surface temperature of the polishing cloth or that of the polished substrate not to be cooled but not to exceed 60° C., and after more than three minutes from the start of the polishing, the polishing is finished within three minutes after the temperature of polished surface of the semiconductor substrate reaches the highest temperature.

SUMMARY OF THE INVENTION

The inventors of the present invention considered the technique for forming the buried wirings by the so-called damascene method in which, after depositing a conductive film mainly containing copper in the trenches formed in an insulator, the conductive film outside the trenches is removed by the CMP. In this examination, the following problems are found.

More specifically, the technique for forming the buried wirings by the damascene method examined by the inventors of the present invention is as follows. First, concave patterns such as the wiring trenches are formed in the predetermined region of the insulator for forming the wiring by etching with using a patterned photoresist film as a mask. Subsequently, a barrier metal layer comprised of a single layer of a TiN (titanium nitride) film, a TaN (tantalum nitride) film, or a Ta (tantalum) film or a laminated film thereof is formed on the whole surface of the substrate and inside the wiring trenches, and then, a Cu film to fill the wiring trenches is deposited. Thereafter, the barrier metal layer and the Cu film outside the wiring trenches are removed by the CMP, and thus, the buried wirings are formed in the wiring trenches.

In the CMP applied to the metal film in the damascene method, the insulator functions as a stopper layer of the polishing. However, since the load from the polishing pad of the CMP equipment is shared by the convex portions in the patterns of the wiring trenches, the polishing speed of the metal film differs depending on the density and the size of the patterns, and as a result, the recessed portion is formed in the wiring or the plug. Since the removal rate of the barrier metal layer is slower than that of the Cu film, the over polishing is necessary to completely remove the barrier metal layer in the region other than the wiring trenches. However, due to the over polishing, the Cu film with the faster removal rate than that of the barrier metal layer is excessively polished in the wiring trenches, and the so-called "dishing" in which the central portion of the wiring is recessed occurs. Also, in the region where the wiring trenches are densely formed, the so-called "erosion" in which the insulator around the wiring trenches is also removed occurs, and the phenomenon that the whole surface in this region is recessed occurs due to the erosion (referred to as "thinning" hereinafter).

When the similar buried wirings are formed in the layer on the wirings with the above-described dishing or the thinning, the surface of the upper insulator for forming the wirings is also recessed due to the underlying recessed surface, and the polishing residue of the Cu film in the CMP is left in the recessed portion. As a result, the buried wirings are short-circuited.

An object of the present invention is to provide a technique capable of forming the buried wirings with a uniform height regardless of the width and the density of the wiring trenches in the process for forming the Cu wirings by filling the conductive film mainly made of Cu into the wiring trenches formed in the insulator.

The above and other objects and novel characteristics of the present invention will be apparent from the description and the accompanying drawings of this specification.

The embodiments of the invention disclosed in this application will be briefly described as follows.

More specifically, the present invention is the manufacturing method of a semiconductor integrated circuit device, which comprises the steps of:

(a) forming an insulator over a semiconductor substrate;

(b) forming trenches by etching of the insulator;

(c) forming a first conductive film on the surface of the insulator and inside the trenches;

(d) forming a second conductive film with a removal rate higher than that of the first conductive film on the surface of the first conductive film and in the trenches so as to fill the trenches;

(e) chemically and mechanically polishing the second conductive film outside the trenches with use of a first polishing pad so as to leave the second conductive film in the trenches; and (f) chemically and mechanically polishing the first conductive film outside the trenches with use of a second polishing pad so as to leave the first conductive film in the trenches, wherein the first polishing pad and the second polishing pad include pores therein, and the diameter of the pores included in the second polishing pad is larger than that in the first polishing pad.

Also, the present invention is the manufacturing method including the steps (a) to (f), wherein the density of the second polishing pad is lower than that of the first polishing pad.

Also, the present invention is the manufacturing method including the steps (a) to (f), wherein the second polishing pad has the hardness of 75 degrees or more measured by the type E durometer in conformity with the JIS K6253, and the density of the second polishing pad is 0.6 g/cm$^3$ or lower.

Also, the present invention is the manufacturing method including the steps (a) to (f), wherein the first polishing pad and the second polishing pad include pores, and the pores with a diameter of 150 μm or smaller are included in the first polishing pad and the pores with a diameter larger than 150 μm and those smaller than 150 μm are both included in the second polishing pad.

BRIEF DESCRIPTIONS OF THE DRAWINGS

FIG. 19 is a sectional view showing the principal part of the semiconductor substrate in the manufacturing process of the semiconductor integrated circuit device subsequent to FIG. 18.

DESCRIPTION OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof is omitted.

First Embodiment

The manufacturing method of a semiconductor integrated circuit device according to the first embodiment will be described with reference to FIGS. 1 to 17.

Figure 1:
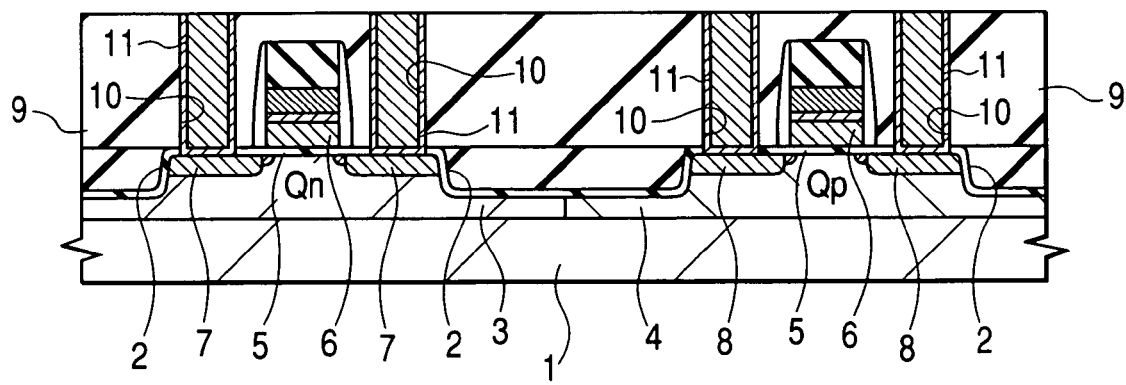
FIG. 1 is a sectional view showing the principal part of the semiconductor substrate for describing the manufacturing method of the semiconductor integrated circuit device according to the first embodiment of the present invention.

First, as shown in FIG. 1, the thermal treatment of a substrate 1 made of single crystal silicon with the specific resistance of about 10 Ωcm is performed at about 850° C. to form a thin silicon oxide film (pad oxide film) with a thickness of about 10 nm on a main surface of the substrate 1. Subsequently, after depositing a silicon nitride film with a thickness of about 120 nm on the silicon oxide film by the CVD (Chemical Vapor Deposition), the silicon nitride film and the silicon oxide film in the device isolation region are removed by the dry etching with a photoresist film as a mask. The silicon oxide film is formed for reducing the stress applied to the substrate when the silicon oxide film to be buried into the device isolation trenches is densified (sintered) in the latter process. Also, because of the oxidation resistant properties, the silicon nitride film is used as a mask to prevent the oxidation of the substrate surface below it (active region).

Subsequently, after forming the trenches with the depth of about 350 nm in the device isolation region of the substrate 1 by the dry etching with using the silicon nitride film as a mask, in order to remove the damaged layer formed by the etching on the inner wall of the trench, a thin silicon oxide film with a thickness of about 10 nm is formed on the inner wall of the trench by the thermal treatment of the substrate 1 at about 1000° C.

Subsequently, after depositing a silicon oxide film on the substrate 1 by the CVD, the thermal treatment of the substrate 1 is performed to densify (sinter) the silicon oxide film in order to improve the film quality of the silicon oxide film. Thereafter, the silicon oxide film is polished by the CMP (Chemical Mechanical Polishing) with using the silicon nitride film as a stopper to leave the silicon oxide film in the trenches. By doing so, the device isolation trenches 2 with a flat surface can be formed.

Subsequently, after removing the silicon nitride film left in the active region of the substrate 1 by the wet etching using the thermal phosphoric acid, B (boron) is ion-implanted into the region of the substrate 1 where the n channel MISFET is to be formed, thereby forming the p well 3. Subsequently, P (phosphorus) is ion-implanted into the region of the substrate 1 where the p channel MISFET is to be formed, thereby forming the n well 4.

Subsequently, after forming a gate oxide film 5 on the surfaces of the p well 3 and the n well 4 by the thermal treatment of the substrate 1, a gate electrode 6 is formed on the gate oxide film 5. The gate electrode 6 is comprised of a three-layered conductive film obtained by laminating a low-resistance polycrystalline silicon film doped with P, a WN (tungsten nitride) film, and a W (tungsten) film in this order.

Next, P or As (arsenic) is ion-implanted into the p well 3 to form the n type semiconductor regions (source, drain) 7, and B is ion-implanted into the n well 4 to form the p type semiconductor regions (source, drain) 8. At the end of the process described above, the n channel MISFET Qn is formed on the p well 3 and the p channel MISFET Qp is formed on the n well 4.

Subsequently, an interlayer insulator 9 made of silicon oxide is formed on the n channel MISFET Qn and the p channel MISFET Qp.

Next, the interlayer insulator 9 is dry etched using a photoresist film (not shown) patterned by the photolithography technique as a mask, thereby forming contact holes 10 on the n type semiconductor regions (source, drain) 7 and the p type semiconductor regions (source, drain) 8. Subsequently, a Ti (titanium) film with a thickness of about 10 nm and a titanium nitride film with a thickness of about 10 nm are sequentially deposited on the substrate 1 and inside the contact holes 10 by the sputtering method. Thereafter, a W (tungsten) film with a thickness of about 500 nm is further deposited by the CVD to fill the contact holes 10. Then, the Ti film, the titanium nitride film, and the W film on the interlayer insulator 9 and outside the contact holes 10 are removed by the CMP, thereby forming plugs 11.

Figure 2:
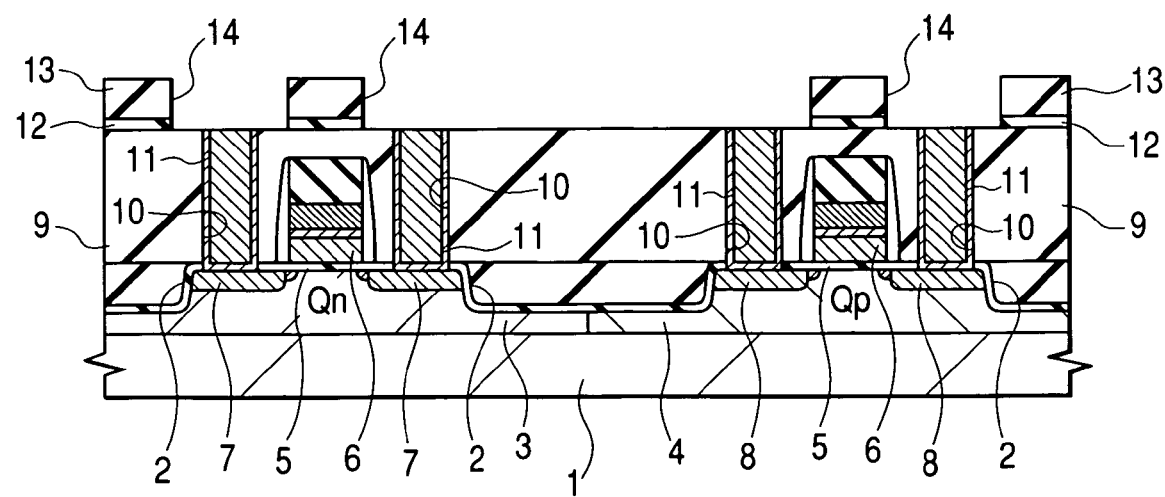
FIG. 2 is a sectional view showing the principal part of the semiconductor substrate in the manufacturing process of the semiconductor integrated circuit device subsequent to FIG. 1.

Next, as shown in FIG. 2, a silicon nitride film is deposited on the substrate 1 by, for example, the CVD, thereby forming an etching stopper film 12. The etching stopper film 12 has a function to prevent the damage to the underlying layer and the degradation of the critical dimension caused by the over-etching of the upper insulator when forming the trenches and holes for forming the wirings in the upper insulator. In this first embodiment, the case where a silicon nitride film is used as the etching stopper film 12 is described. However, an SiC (silicon carbide) film deposited by the plasma CVD or an SiCN (silicon carbon nitride) film obtained by adding a predetermined amount of N (nitrogen) in the SiC film can also be used instead of the silicon nitride film. Since the SiC film and the SiCN film have the relative dielectric constant relatively lower than that of the silicon nitride film, the wiring delay in the semiconductor integrated circuit device according to the first embodiment can be improved by using the SiC film or the SiCN film as the etching stopper film 12.

Next, a silicon oxide film is deposited on the surface of the etching stopper film 12 by the CVD to form an interlayer insulator 13 with a thickness of about 200 nm. It is also possible to add F (fluorine) to silicon oxide when forming the interlayer insulator 13. Since it is possible to reduce the dielectric constant of the interlayer insulator 13 by adding F thereto, the total dielectric constant in the wiring of the semiconductor integrated circuit device can be reduced, and thus, the wiring delay can be improved.

Subsequently, the etching stopper film 12 and the interlayer insulator 13 are processed by the photolithography technique and the dry etching technique to form the wiring trenches 14 for forming the buried wiring. Next, the surface treatment of the substrate 1 is performed by the sputter etching in the Ar (Argon) atmosphere in order to remove the reaction layer on the surfaces of the plugs 11 exposed on the bottom of the wiring trenches 14.

Figure 3:
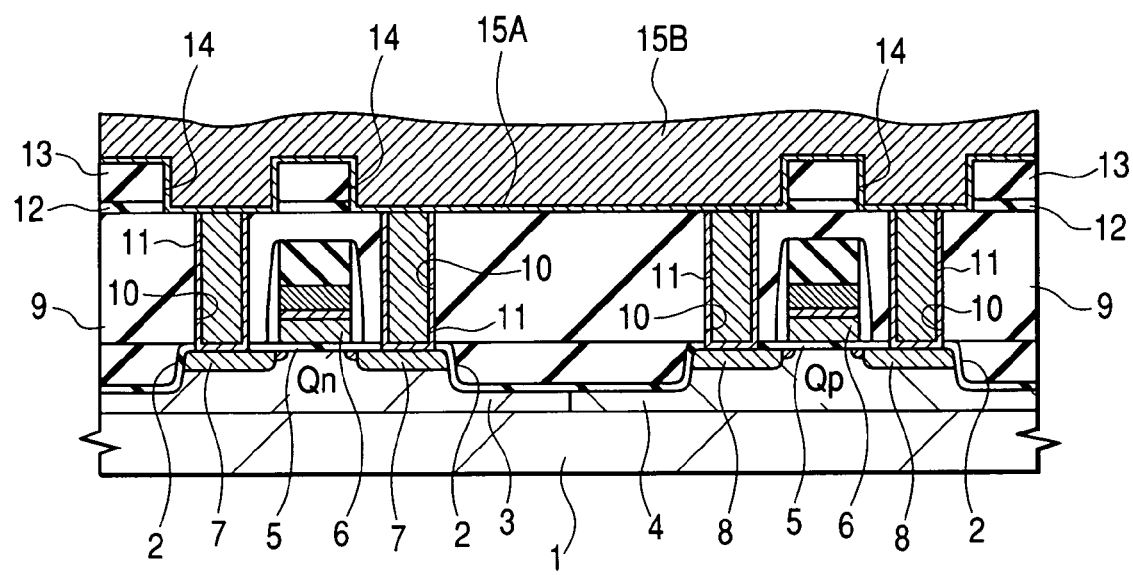
FIG. 3 is a sectional view showing the principal part of the semiconductor substrate in the manufacturing process of the semiconductor integrated circuit device subsequent to FIG. 2.

Next, as shown in FIG. 3, a tantalum nitride film to form a barrier conductor film 15A is deposited on the whole surface of the substrate 1 by the reactive sputtering of the tantalum target in the argon-nitrogen mixed atmosphere. This tantalum nitride film is deposited in order to improve the adhesion of the Cu (copper) film deposited in the latter process and to prevent the diffusion of the Cu, and the thickness of the tantalum nitride film is, for example, about 30 nm. Note that the case where a tantalum nitride film is used as the barrier conductor film 15A is described in the first embodiment. However, the metal film made of tantalum or the like, the laminated film of tantalum nitride and tantalum, a titanium nitride film or the laminated film of a metal film and a titanium nitride film can also be used as the barrier conductor film 15A. In the case where the barrier conductor film 15A is made of tantalum or tantalum nitride, the adhesion with the Cu film is improved over the case of using titanium nitride. Also, in the case where the barrier conductor film 15A is made of titanium nitride, it is also possible to perform the sputter etching of the surface of the titanium nitride film just before the deposition of the Cu film in the latter process. By the sputter etching like this, water and oxygen molecules adsorbed on the surface of the titanium nitride film are removed and the adhesion of the Cu film can be improved. This technique is quite effective in the case where the Cu film is deposited after the deposition of the titanium nitride film and the air break of the titanium nitride film to expose it to the air. Note that the technique is effective not only to the titanium nitride film but also to the tantalum nitride film, though there is the difference in effectiveness.

Subsequently, a Cu film or a Cu alloy film to form a seed film is deposited on the whole surface of the substrate 1 on which the barrier conductor film 15A is deposited. In the case where the Cu alloy film is formed as the seed film, the concentration of Cu in this alloy should be 80 wt % or more. The seed film is deposited by the ionized sputtering in which the Cu sputtering atoms are ionized to improve the directionality of the sputtering, and the thickness of the seed film is about 100 to 200 nm, more preferably, about 150 nm on the surface of the barrier conductor film 15A except the inside of the wiring trenches 14. In this first embodiment, the case where the ionized sputtering is used to deposit the seed film is described. However, it is also possible to use the long throw sputtering. Also, the seed film can be deposited by the CVD, and since the high vacuum can be maintained if the CVD forming unit is connected to the forming chamber of the barrier conductor film 15A, the oxidation of the surface of the deposited barrier conductor film 15A can be prevented.

Next, the Cu film is deposited on the whole surface of the substrate 1 on which the seed film is deposited so as to fill the wiring trenches 14 with the Cu film, and the conductive film 15B comprised of the Cu film and the above-mentioned Cu seed film is formed. The Cu film to fill the wiring trenches 14 is formed by, for example, the electroplating method using the plating solution containing $H_2SO_4$ (sulfuric acid), 10% of $CuSO_4$ (copper sulfate), and an additive for improving the coverage of the copper film. In the case where the electroplating method is used to form the Cu film to fill the wiring trenches 14, the growth rate of the Cu film can be electrically controlled. Therefore, the coverage of the Cu film in the wiring trenches 14 can be improved. Note that the case where the electroplating method is used to deposit the Cu film to fill the wiring trenches 14 is described in this first embodiment. However, it is also possible to use the electroless plating method. In the case where the electroless plating method is used, it is unnecessary to apply the voltage. Therefore, the damage on the substrate 1 caused by the applied voltage can be significantly reduced in comparison to the case of using the electroplating method.

Subsequently, the distortion of the Cu film is reduced by the annealing, thereby improving the film quality of the Cu film.

Figure 4:
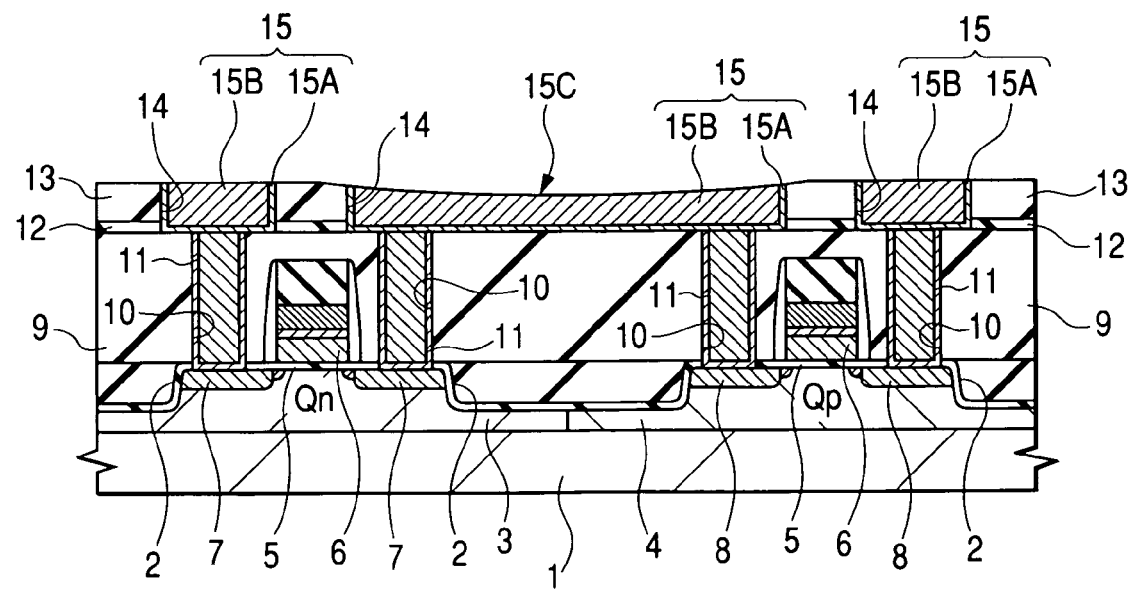
FIG. 4 is a sectional view showing the principal part of the semiconductor substrate in the manufacturing process of the semiconductor integrated circuit device subsequent to FIG. 3.

Next, as shown in FIG. 4, the unnecessary portions of the barrier conductor film 15A and the conductive film 15B on the interlayer insulator 13 are removed to leave the barrier conductor film 15A and the conductive film 15B into the wiring trenches 14. By doing so, the buried wirings 15 are formed. The removal of the barrier conductor film 15A and the conductive film 15B is made by the polishing using the CMP. At this time, the over-polish is necessary in order to completely remove the barrier conductor film 15A in the region other than the wiring trenches 14. In addition, since the removal rate of the barrier conductor film 15A is lower than that of the conductive film 15B, the conductive film 15B buried in the wiring trench 14 with a relatively larger width is selectively polished in this over polishing process, and as a result, the recessed portion 15C is formed at the central portion of the conductive film 15B.

Figure 5:
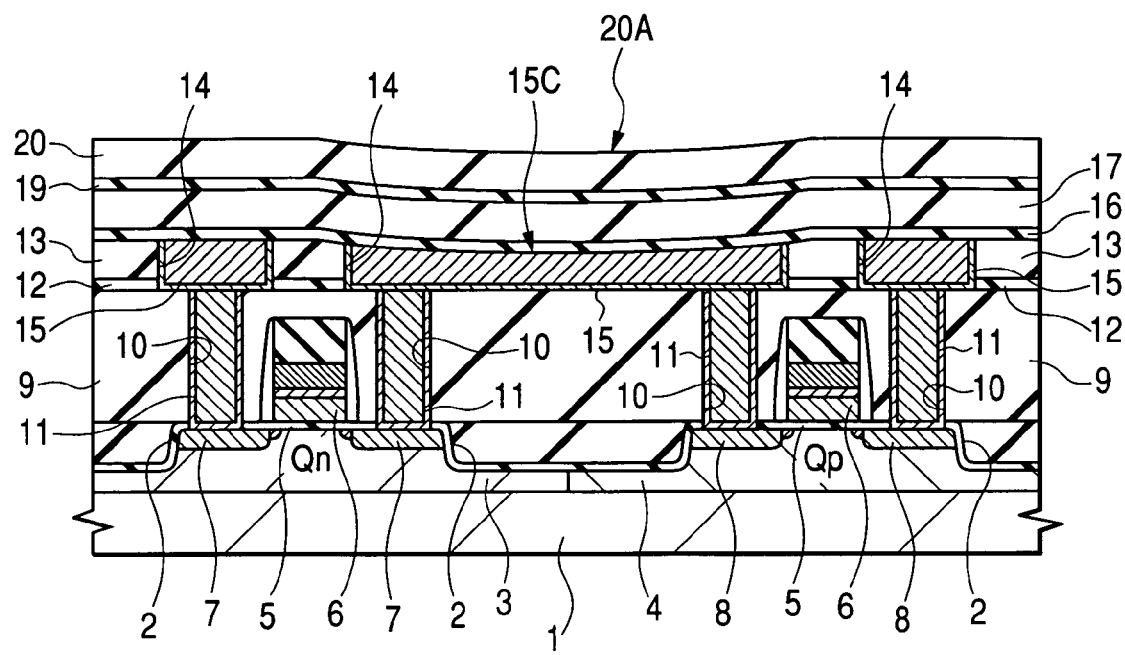
FIG. 5 is a sectional view showing the principal part of the semiconductor substrate in the manufacturing process of the semiconductor integrated circuit device subsequent to FIG. 4.
Figure 6:
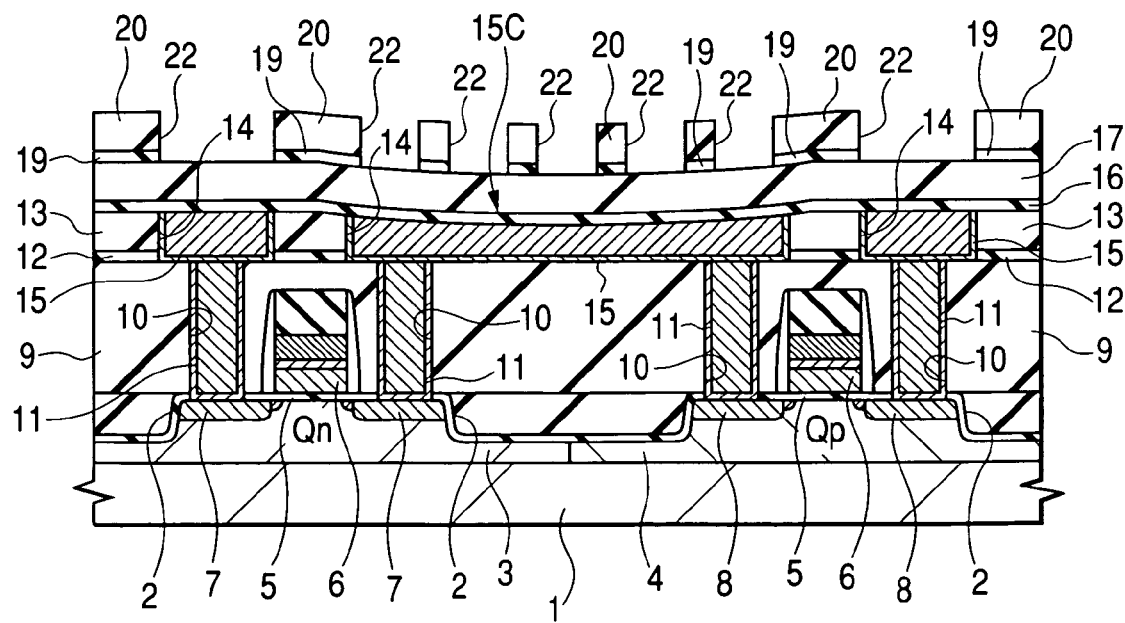
FIG. 6 is a sectional view showing the principal part of the semiconductor substrate in the manufacturing process of the semiconductor integrated circuit device subsequent to FIG. 5.

After forming the buried wiring 15, the two-stage brush scrubbing is performed with using the 0.1% ammonium citrate and deionized water as shown in FIG. 5. By doing so, the abrasive grains and Cu adhered to the surface of the substrate 1 are removed.

Subsequently, a silicon nitride film is deposited on the buried wiring 15 and the interlayer insulator 13 to form an etching stopper film 16. The plasma CVD can be used to deposit the silicon nitride film, and the silicon nitride film has a thickness of about 50 nm. Similar to the etching stopper film 12 (see FIG. 2), it is possible to use the SiC film or the SiCN film as the etching stopper film 16. The etching stopper film 16 can function as the etching stopper layer in the etching of the latter process. Also, since the etching stopper film 16 also has a function to reduce the diffusion of Cu constituting the conductive film 15B of the buried wiring 15, the etching stopper film 16 together with the barrier conductive film 15A (see FIG. 3) prevent the diffusion of Cu into the interlayer insulators 9 and 13 and to the insulator formed later on the etching stopper 16, and retains the insulation therebetween.

Next, an insulator 17 with a thickness of about 200 nm is deposited on the surface of the etching stopper film 16. A low-dielectric film (SIOF film) such as a CVD oxide film added with fluorine can be shown as an example of this insulator 17. In the case where the low-dielectric film is used, the total dielectric constant in the wiring of the semiconductor integrated circuit device can be reduced and the wiring delay can be improved.

Next, a silicon nitride film is deposited on the surface of the insulator 17 by, for example, the plasma CVD to form an etching stopper film 19 with a thickness of about 25 nm. Similar to the etching stoppers 12 and 16, it is possible to use the SiC film or the SiCN film as the etching stopper film 19. This etching stopper film 19 has a function to prevent the damage to the underlying layer and the degradation of the critical dimension caused by the over-etching of the upper insulator when forming the trenches and holes for forming the wirings in the upper insulator in the latter process.

Next, a silicon oxide film is deposited on the surface of the etching stopper film 19 by, for example, the CVD to form an insulator 20 with a thickness of about 225 nm. Similar to the insulator 17, a low-dielectric film such as a CVD oxide film added with fluorine can be used as the insulator 20. By doing so, it is possible to reduce the total dielectric constant and also possible to improve the wiring delay in the semiconductor integrated circuit device according to the first embodiment. At this time, a recessed portion 20A is formed also on the surface of the insulator 20 due to the recessed portion 15C on the underlying buried wiring 15. Note that, though not shown, a silicon nitride film is deposited by, for example, the plasma CVD on the surface of the insulator 20, after forming the insulator 20. By doing so, an etching stopper film similar to the etching stopper films 12, 16, and 19 is formed.

Next, contact holes to connect the buried wiring 15 and the upper buried wiring formed in the latter process are formed. Note that the contact hole is formed in the region not shown in FIG. 6. Also, the contact hole can be formed in the manner as follows. First, a photoresist film with the same shape as the pattern of the contact hole connected to the buried wiring 15 is formed on the insulator 20 in the photolithography process. Then, the insulator 20, the etching stopper film 19, the insulator 17, and the etching stopper film 16 are sequentially dry etched with using the photoresist film as a mask. Subsequently, the photoresist film is removed and a photoresist film with the same shape as the pattern of the wiring trenches is formed on the insulator 20 in the photolithography process. Then, the insulator 20 and the etching stopper film 19 are sequentially dry etched with using the photoresist film as a mask. By doing so, the wiring trenches (trench portions) 22 with the width of about 0.25 to 50 μm are formed in FIG. 6.

Figure 7:
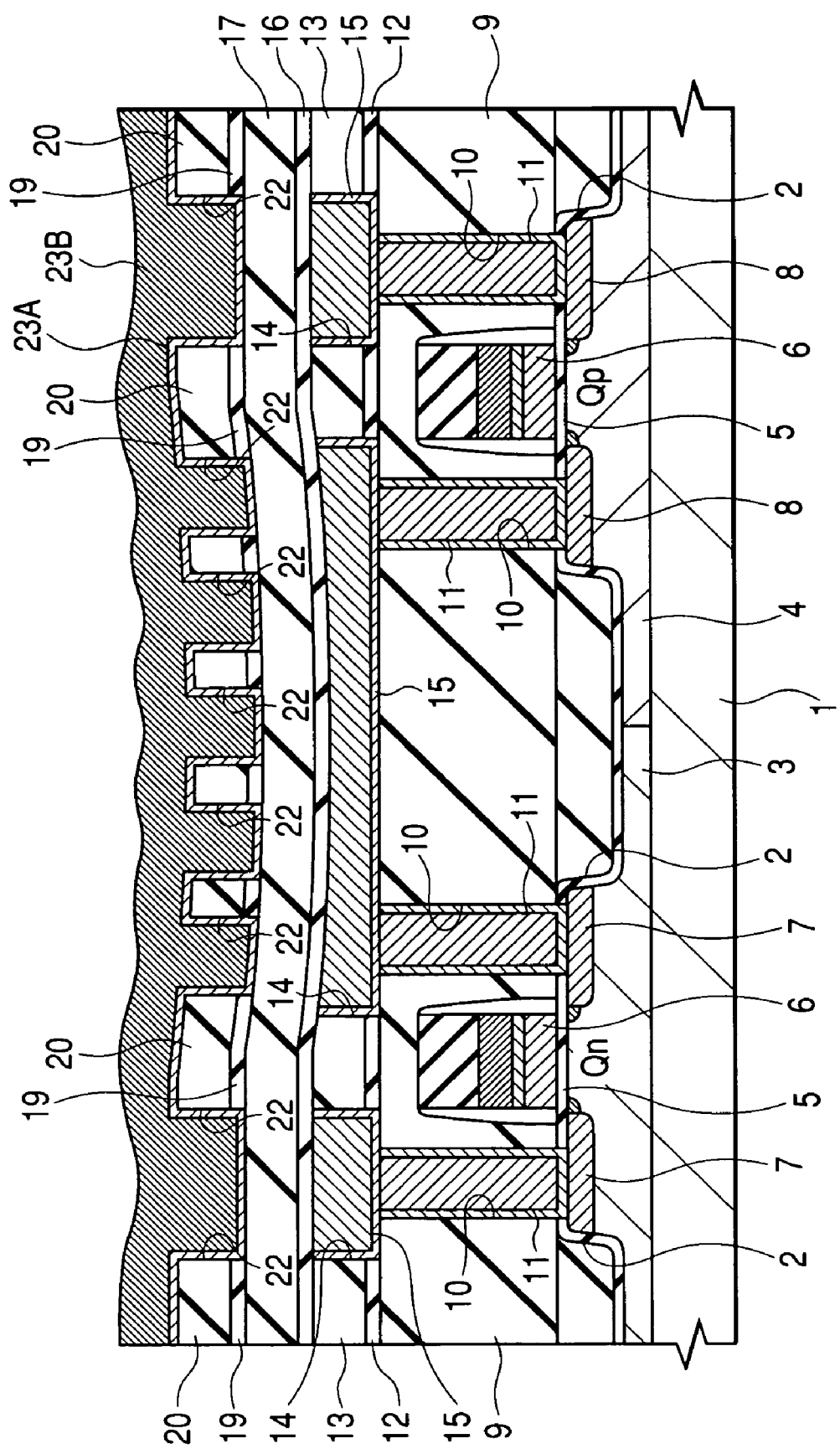
FIG. 7 is a sectional view showing the principal part of the semiconductor substrate in the manufacturing process of the semiconductor integrated circuit device subsequent to FIG. 6.

Next, as shown in FIG. 7, a barrier conductor film (first conductive film) 23A with a thickness of about 50 nm is deposited in the same process as that for depositing the barrier conductor film 15A. For example, a tantalum film can be used as the barrier conductor film 23A. Note that the tantalum film is shown as an example of the barrier conductor film 23A in this first embodiment. However, a tantalum nitride film, a titanium nitride film, or a laminated film of a metal film such as a tantalum film and a nitride film can be used as the barrier conductor film 23A. Also, in the case where the titanium nitride film is used as the barrier conductor film 23A, it is possible to perform the sputter etching of the surface of the titanium nitride film just before the deposition of the Cu film in the latter process.

Subsequently, a Cu film or a Cu alloy film to form the seed film is deposited on the whole surface of the substrate 1 on which the barrier conductor film 23A is deposited. In the case where the Cu alloy film is used as the seed film, the concentration of Cu in this alloy should be 80 wt % or more. The seed film can be deposited by, for example, the long throw sputtering. The case where the long throw sputtering is used to deposit the seed film is shown as an example in this first embodiment. However, it is also possible to use the ionized sputtering in which the Cu sputtering atoms are ionized to improve the directionality of the sputtering. In addition, the seed film can be deposited by the CVD.

Next, a conductive film with a thickness of about 750 nm comprised of, for example, a Cu film is deposited on the whole surface of the substrate 1 on which the seed film is deposited so as to fill the contact holes and the wiring trenches 22, and the conductive film combined with the above-mentioned seed film is used as the conductive film (second conductive film) 23B. This conductive film to fill the contact holes and the wiring trenches 22 can be formed by, for example, the electroplating method. Subsequently, the distortion of the conductive film 23B is removed by the annealing, thereby stabilizing the film quality thereof.

Figure 8:
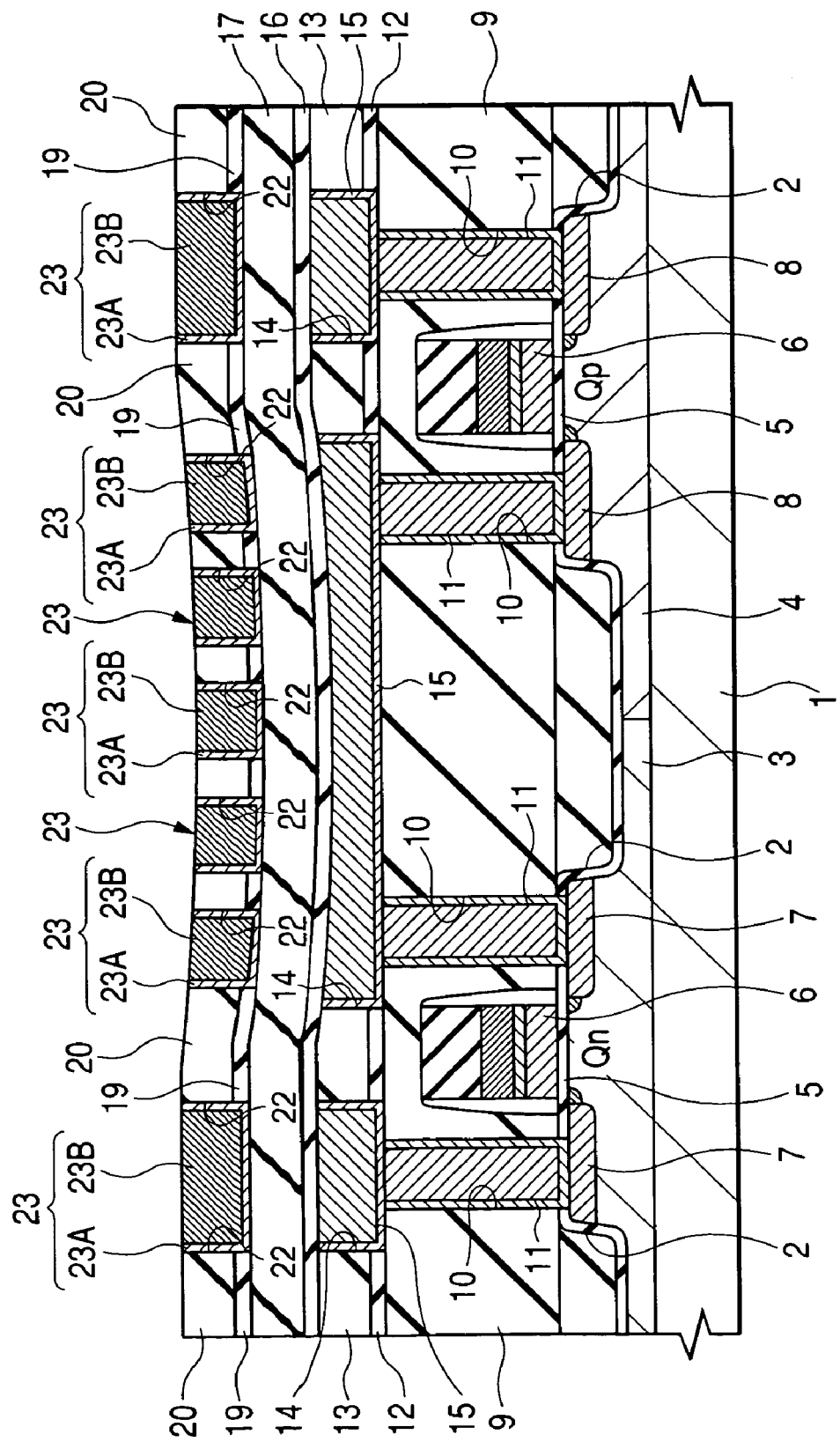
FIG. 8 is a sectional view showing the principal part of the semiconductor substrate in the manufacturing process of the semiconductor integrated circuit device subsequent to FIG. 7.

Next, as shown in FIG. 8, the unnecessary barrier conductor film 23A and the conductive film 23B on the insulator 20 are removed by the polishing using the CMP to leave the barrier conductor film 23A and the conductive film 23B into the contact holes and the wiring trenches 22. By doing so, the buried wirings 23 are formed.

Here, the CMP process used when forming the buried wirings 23 will be described in detail. First, in the polishing of the conductive film 23B mainly made of Cu, the slurry obtained by adding oxidizing agent such as hydrogen peroxide to the polishing agent containing alumina or silica, which can increase the removal rate of the conductive film 23B to be faster than the barrier conductor film 23A comprised of a Ta film by almost 10 times or more, for example, iCue5003 produced by Cabot Microelectronics Corporation and HSC430 containing no abrasive grains produced by Hitachi Chemical Co., Ltd. is used, and also, the polishing pad (first polishing pad) made of polyurethane which is comprised of the foam containing uniform pores with an average diameter of about 150 μm or smaller and a density of about 0.6 g/cm³ or higher (for example, IC1000 produced by Rodel, Inc. (density of 0.73 g/cm³, hardness of 95 degrees measured by the type E durometer in conformity with the JIS K6253, and average pore diameter of about 100 μm)) is used. Under the polishing conditions described above, the conductive film 23B outside the wiring trenches 22 is polished until the polishing reaches the barrier conductor film 23A outside the wiring trenches 22 serving as the polishing end, and then, the barrier conductor film 23A outside the wiring trenches 22 is polished under the different polishing conditions. In the polishing of the barrier conductor film 23A, the slurry obtained by adding oxidizing agent such as hydrogen peroxide to the polishing agent which can control the removal rate of the underlying insulator 20 comprised of a silicon oxide film to the barrier conductor film 23A to almost one twentieth or less, for example, HS-T605 produced by Hitachi Chemical Co., Ltd is used. By using the above-mentioned slurry, the polishing amount of the insulator 20 can be about 10 nm when the polishing time of the insulator 20 is equal to the polishing time required for the polishing of about 50 nm of the barrier conductor film 23A (Ta film) and the over-polish equivalent to about 50% thereof. More specifically, the slurry can increase the removal rate of the barrier conductor film 23A twice to five times of that of the conductive film 23B. Also, the polishing pad (second polishing pad) made of polyurethane with a hardness of 75 degrees or more measured by the type E durometer in conformity with the JIS K6253 which is comprised of the foam containing non-uniform pores with an average diameter of about 150 μm or more and a density of about 0.4 to 0.6 g/cm³ (for example, MHS15A produced by Rodel, Inc. (density of 0.53 g/cm³, hardness of 80 degrees measured by the type E durometer in conformity with the JIS K6253, and average pore diameter of about 100 to 2000 μm)) is used. Note that, in the following description, the polishing pad used in the polishing of the barrier conductor film 23A is referred to as a non-uniform polyurethane-foam pad, and the polishing pad used in the polishing of the conductive film 23B is referred to as a uniform polyurethane-foam pad.

Figure 9:
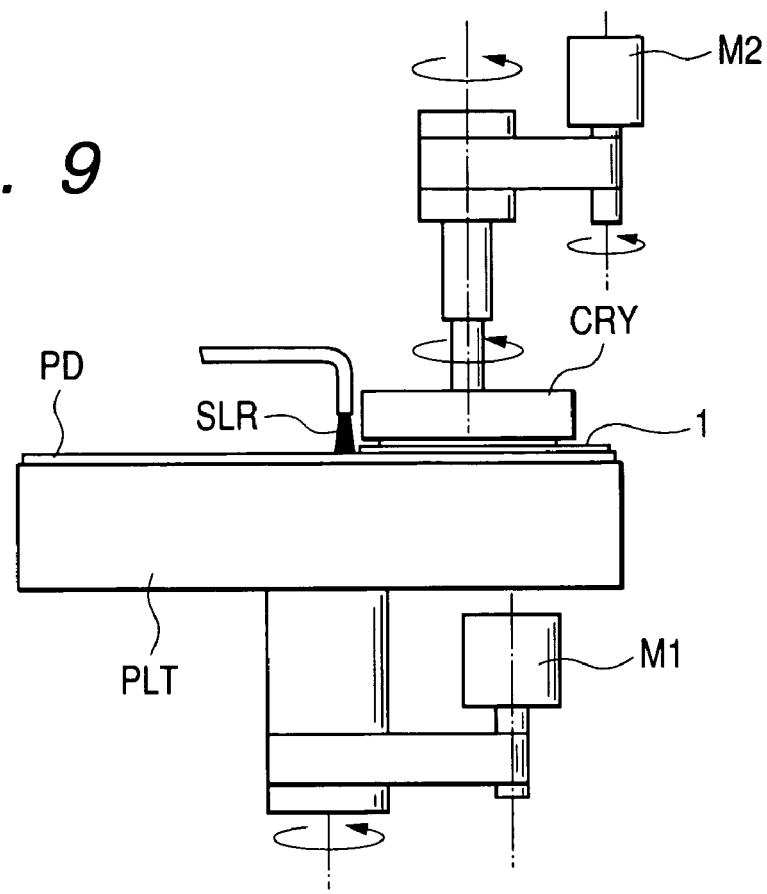
FIG. 9 is an explanatory diagram of the CMP equipment used in the manufacture of the semiconductor integrated circuit device according to the first embodiment of the present invention.
Figure 10:
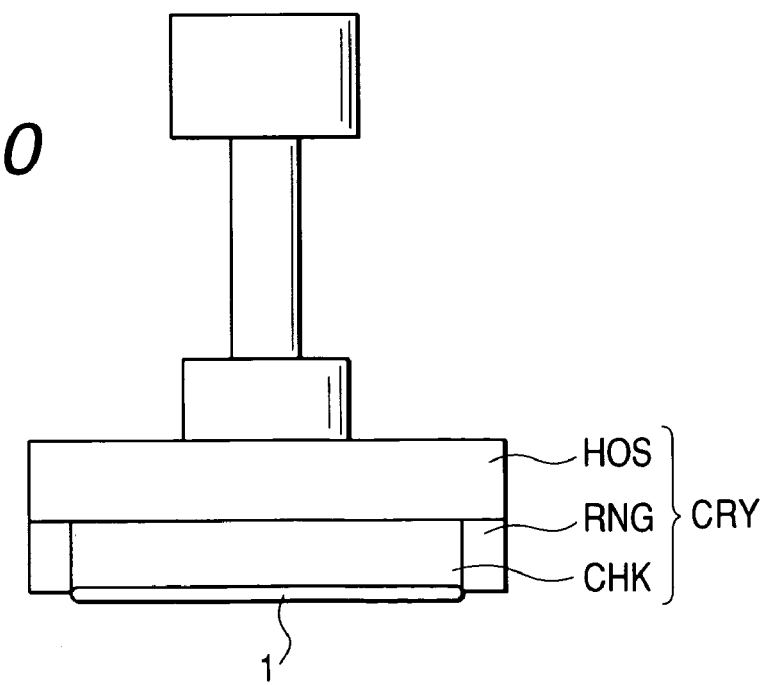
FIG. 10 is an explanatory diagram showing the principal part of the CMP equipment shown in FIG. 9.

Also, in the polishing of the conductive film 23B and the barrier conductor film 23A, the CMP equipment as shown in FIG. 9 is used. In this CMP equipment, a polishing pad PD is mounted on a platen PLT rotated by the driving force of a motor M1. A carrier CRY holds a wafer (substrate 1) with the main surface of the wafer facing to the polishing pad PD and is rotated by the driving force of a motor M2. In such a condition, the conductive film 23B and the barrier conductor film 23A formed on the main surface of the wafer are chemically and mechanically polished by the rotation of the platen PLT and the carrier CRY with supplying the slurry SLR to the surface of the polishing pad PD. Also, FIG. 10 shows the carrier CRY in the CMP equipment shown in FIG. 9. The carrier CRY is comprised of a wafer chuck CHK for holding the wafer, a retainer ring RNG for preventing the drop of the wafer during the polishing, a housing HOS for holding these components and applying the polishing pressure to the wafer, and the like. In this first embodiment, during the polishing of the barrier conductor film 23A, the revolutions of the platen PLT is 83 rev/minute, the polishing pressure applied from the housing HOS to the wafer is 2 psi (about 140 g/cm²), and the pressure applied from the retainer ring RNG to the wafer is about 2.7 psi (about 189 g/cm²).

Figure 11:
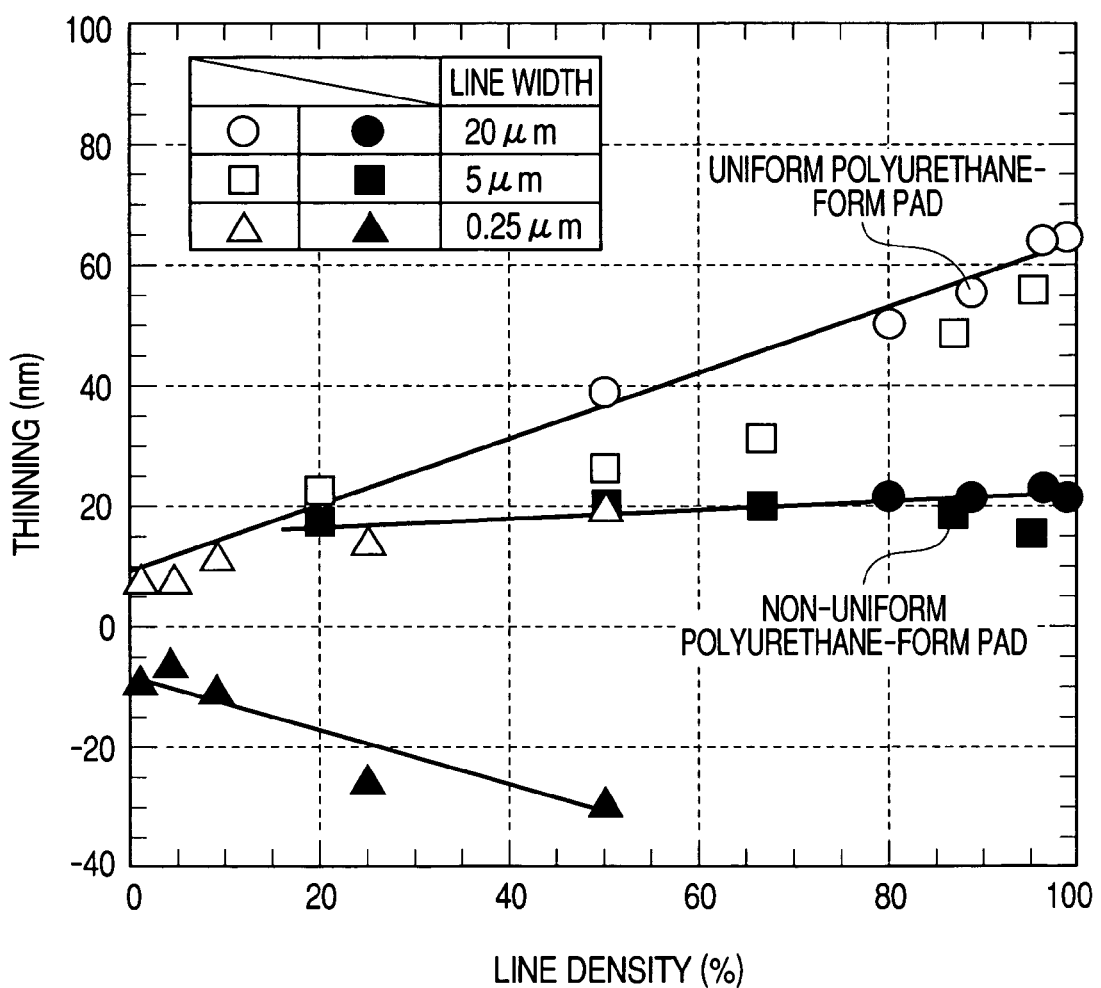
FIG. 11 is an explanatory diagram showing the relationship between the line density and the thinning of the buried wirings formed by the CMP process performed in the manufacturing process of the semiconductor integrated circuit device according to the first embodiment of the present invention.
Figure 12:
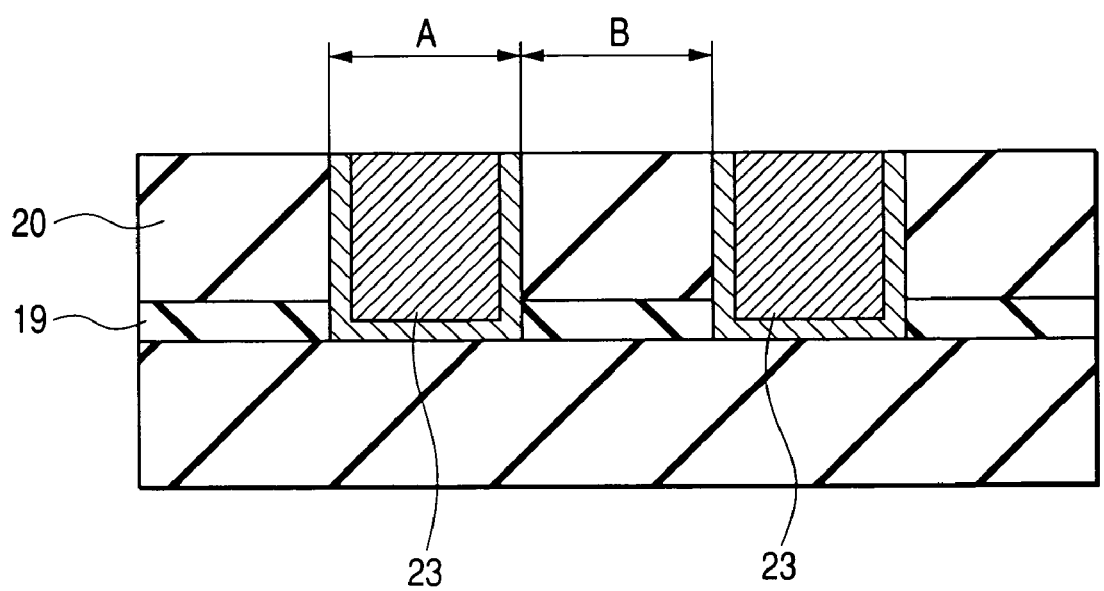
FIG. 12 is a sectional view for describing the line density.

FIG. 11 shows the relationship between the line density of the buried wirings 23 and the thinning due to the erosion in the case where the buried wirings 23 are formed by the CMP process under the above-mentioned conditions in the first embodiment. In FIG. 11, the results in each of the cases where the line width is about 0.25 μm, about 5 μm, and about 20 μm are shown. Also, in the examples shown in FIG. 11, the polished amount of the barrier conductor film 23A including the amount of the over-polish is equivalent to about twice of the thickness of the barrier conductor film 23A. Furthermore, the relationship between the line density of the buried wirings 23 and the thinning in the case where the uniform polyurethane-foam pad used in the polishing of the conductive film 23B is used in the polishing of the barrier conductor film 23A is also shown in FIG. 11. Note that, as shown in FIG. 12, the line density is represented by the formula: 100×A(A+B) when the line width of the buried wiring 23 is defined as A and the space between the adjacent buried wirings 23 is defined as B, and it represents the density of the buried wirings 23.

As shown in FIG. 11, in the case where the uniform polyurethane-foam pad is used in the polishing of the barrier conductor film 23A, the thinning is increased as the line density is increased. Meanwhile, in the case where the buried wirings 23 are formed by the CMP process under the conditions described in the first embodiment, the erosion of the insulator 20 between the buried wirings 23 can be made uniform. Therefore, even if the line density is increased, the thinning is not increased and can be controlled to a certain range. In addition, if compared at the line density of about 98% in the case where the line width of the buried wiring 23 is about 20 µm, the thinning can be reduced to about ⅓ under the conditions described in the first embodiment in comparison to the case of using the uniform polyurethane-foam pad. As described above, since the thinning can be reduced, it becomes possible to prevent the following problem. That is, when the buried wirings similar to the buried wirings 23 are formed in the upper layer of the buried wrings 23, the surface of the upper insulator for forming the buried wirings is recessed due to the thinning of the underlying wiring layer in which the buried wirings 23 are formed, and the polishing residue of the conductive film in the CMP is left in the recessed portion, and as a result, the buried wirings in the upper layer are short-circuited.

Figure 13:
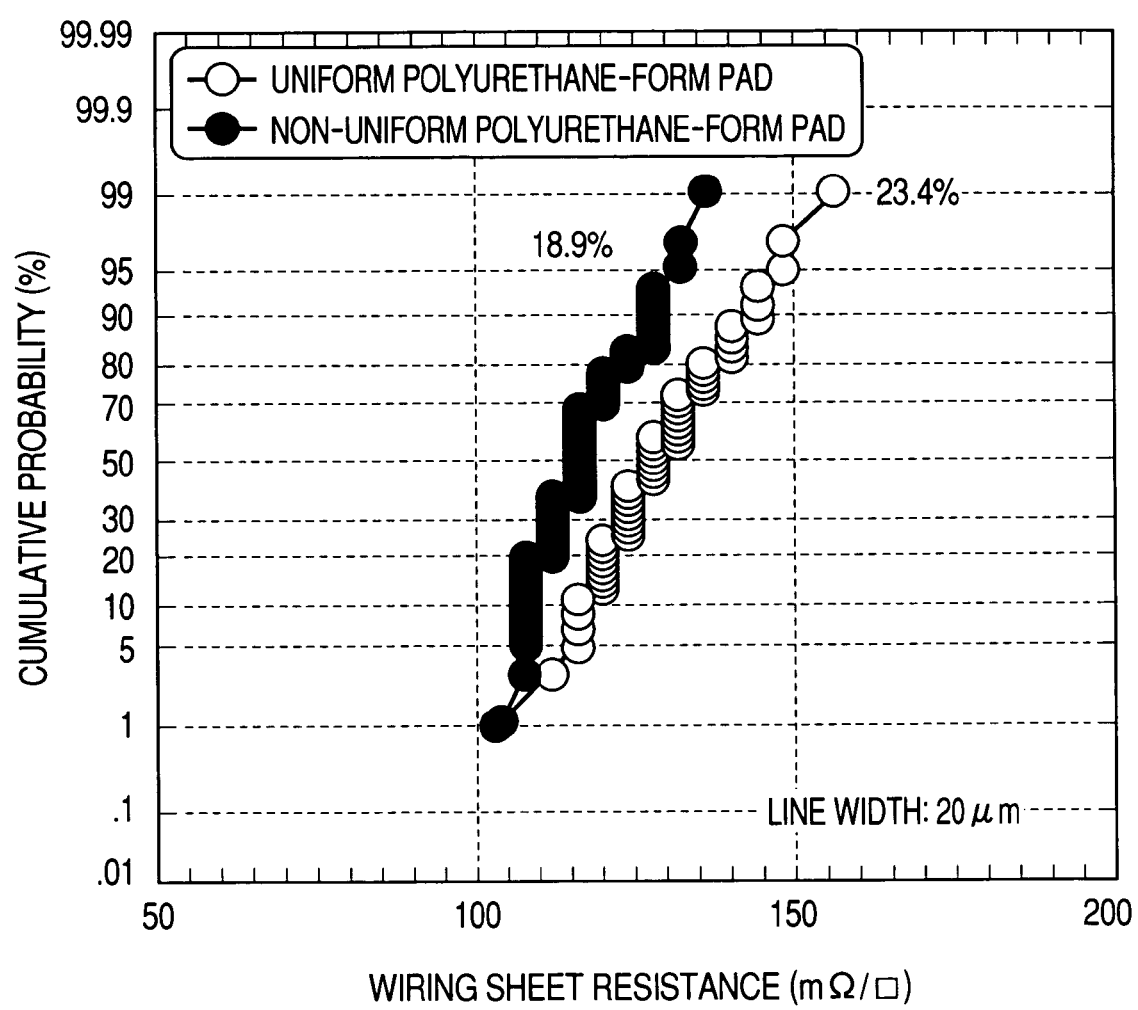
FIG. 13 is an explanatory diagram showing the frequency distribution of the sheet resistance of the buried wirings formed by the CMP process performed in the manufacturing process of the semiconductor integrated circuit device according to the first embodiment of the present invention.

In addition, FIG. 13 shows the cumulative probability of the sheet resistance of the buried wirings 23 in the case where the buried wirings 23 with the line width of about 20 µm and the space between the wirings of about 0.25 µm are formed by the CMP process under the polishing conditions described in the first embodiment. In addition, FIG. 13 also shows the cumulative probability of the sheet resistance of the buried wirings 23 in the case where the uniform polyurethane-foam pad used in the polishing of the conductive film 23B is used in the polishing of the barrier conductor film 23A.

As shown in FIG. 13, the variation of the sheet resistance of the buried wirings 23 represented by 3σ when the standard deviation is defined as σ is about 23.4% in the case where the uniform polyurethane-foam pad is used in the polishing of the barrier conductor film 23A. Meanwhile, the variation of the sheet resistance can be reduced to about 18.9% in the case where the CMP process is performed under the conditions described in the first embodiment. More specifically, according to the first embodiment, it is possible to reduce the variation in height of the buried wirings 23. Also, in the case of using the CMP process under the conditions described in the first embodiment, the sheet resistance of the buried wirings 23 itself can be reduced by about 10% in comparison to the case of using the uniform polyurethane-foam pad in the polishing of the barrier conductor film 23A. More specifically, the erosion of the insulator 20 between the buried wirings 23 (wiring trenches 22) can be made uniform regardless of the line density. Therefore, it becomes possible to prevent the reduction of the height of the buried wirings 23 due to the erosion, and it is possible to form the buried wirings 23 with a predetermined height.

As mentioned, the case where the uniform polyurethane-foam pad is used in the polishing of the conductive film 23B mainly made of Cu by the CMP is described in the first embodiment. However, it is also possible to use the non-uniform polyurethane-foam pad used in the polishing of the barrier conductor film 23A comprised of a Ta film. According to the experiment by the inventors of this invention, when the non-uniform polyurethane-foam pad is used to polish the conductive film 23B, the conductive film 23B outside the wiring trenches 22 can be completely removed. More specifically, by polishing the conductive film 23B with the non-uniform polyurethane-foam pad, the polishing residue of the conductive film 23B outside the wiring trenches 22 can be certainly prevented.

After forming the buried wirings 23, the two-stage brush scrubbing using the 0.1% ammonium citrate and deionized water is performed. By doing so, the abrasive grains and copper adhered to the surface of the substrate 1 are removed. Then, the semiconductor integrated circuit device according to the first embodiment is manufactured.

Note that it is also possible to form the additional multi-layered wirings on the buried wirings 23 by repeating the process similar to that described with reference to FIGS. 5 to 8.

Second Embodiment

Next, the manufacturing process of the semiconductor integrated circuit device according to the second embodiment will be described.

The manufacturing process in this second embodiment is almost identical to that described in the first embodiment. However, a pad obtained by making some changes to the uniform polyurethane-foam pad used in the polishing process of the conductive film 23B (see FIG. 7) by the CMP is used as the polishing pad in the polishing process of the barrier conductor film 23A (see FIG. 7) by the CMP when forming the buried wirings 23 (see FIG. 8).

Figure 14:
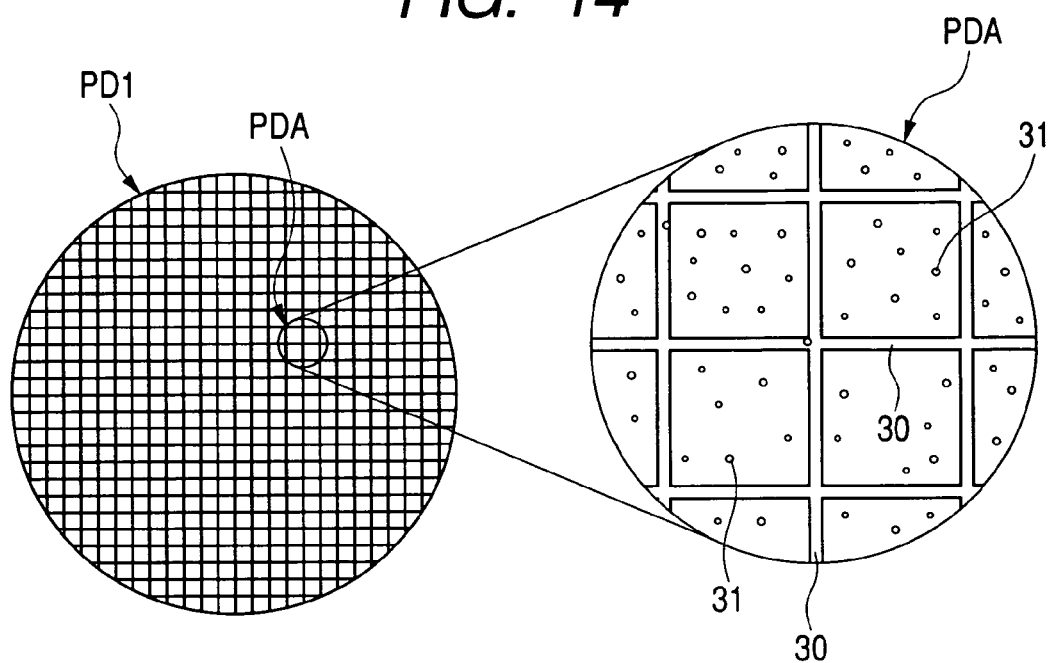
FIG. 14 is a plan view showing the principal part of the polishing pad used in the CMP process performed in the manufacturing process of the semiconductor integrated circuit device according to the second embodiment of the present invention.
Figure 15:
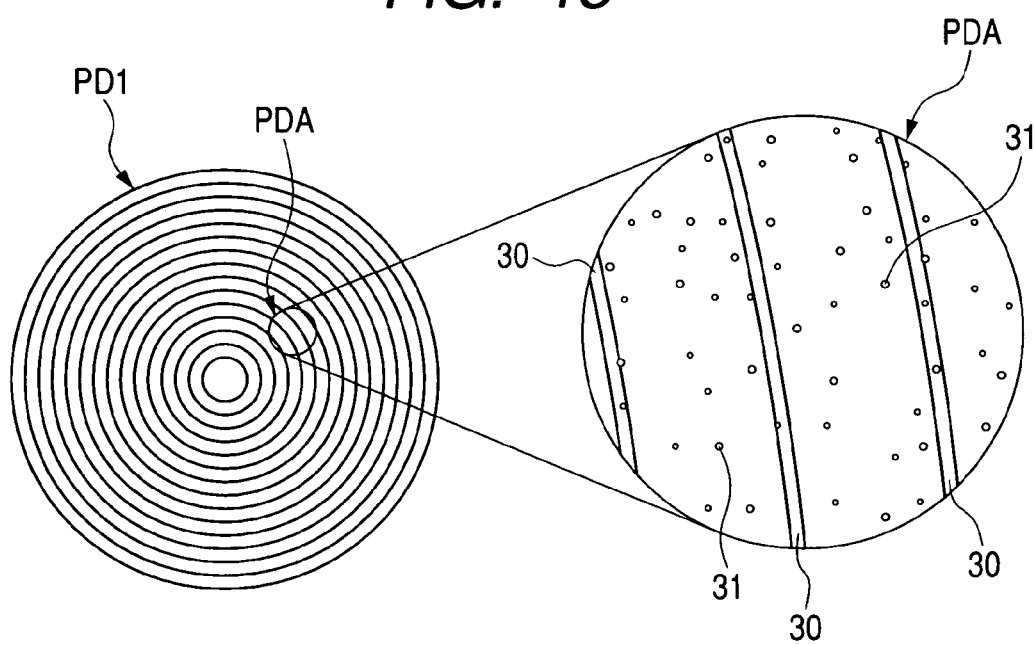
FIG. 15 is a plan view showing the principal part of the polishing pad used in the CMP process performed in the manufacturing process of the semiconductor integrated circuit device according to the second embodiment of the present invention.

FIGS. 14 and 15 are plan views of the polishing pad PD1 used in the polishing process of the barrier conductor film 23A by the CMP in the second embodiment, and an area of the pad PDA is enlarged and shown therein. Although not shown in the first embodiment, trenches 30 with a predetermined width and depth are provided at a predetermined interval therebetween in the polishing pad PD1 so as to form a lattice shape (see FIG. 14) or a concentric shape (see FIG. 15). The trenches 30 are formed for the purpose of the improvement of the fluidity of the slurry on the surface of the polishing pad PD1, the improvement of the uniformity in the surface of the wafer (substrate 1 (see FIG. 8)), the prevention of the sticking of the wafer to the polishing pad PD1, the improvement of the planarization efficiency of the wafer, and the active removal of the polished matter from the surface of the polishing pad PD1. In this second embodiment, holes 31 are formed on the surface of the polishing pad PD1 by the use of a needle and a punch. By doing so, the hardness of the polishing pad PD1 is reduced to the level equivalent to that of the non-uniform polyurethane-foam pad used in the polishing of the barrier conductor film 23A in the first embodiment. The diameter of the holes 31 is preferably 2 mm or smaller. The same effects as those in the first embodiment can be achieved by using the polishing pad PD1 as mentioned above in the polishing of the barrier conductor film 23A.

Third Embodiment

Next, the manufacturing process of the semiconductor integrated circuit device according to the third embodiment will be described.

Figure 16:
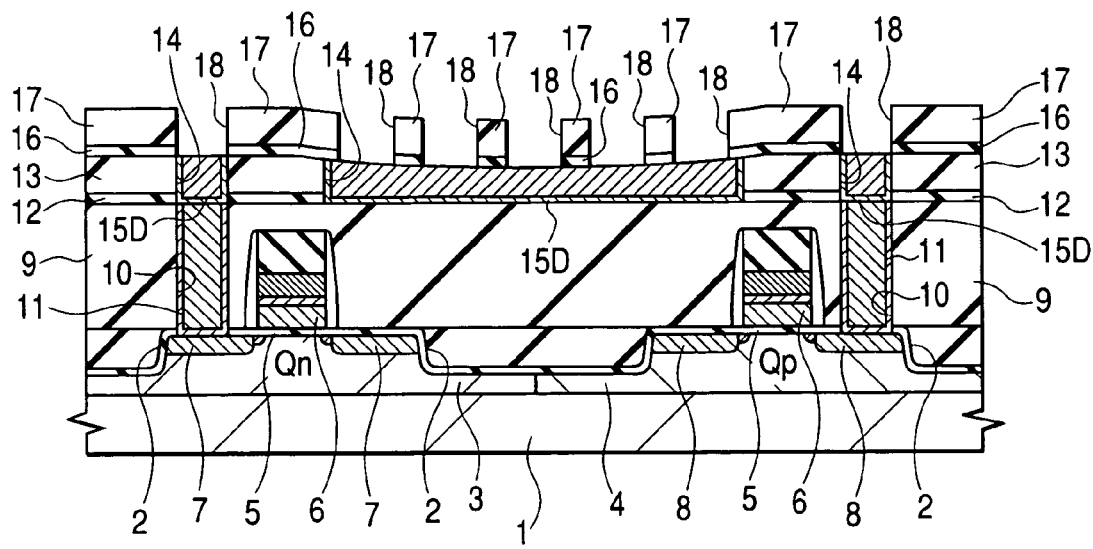
FIG. 16 is a sectional view showing the principal part of the semiconductor substrate for describing the manufacturing method of the semiconductor integrated circuit device according to the third embodiment of the present invention.

In the first embodiment, a Cu layer is formed as the main conductive layer of the buried wiring 15 in the first layer. Instead, a W layer is formed as the main conductive layer of the buried wiring in the first layer in this third embodiment. More specifically, as shown in FIG. 16, after forming the wiring trenches 14 in the same process as the first embodiment, a titanium nitride film is deposited on the interlayer insulator 13 and in the wiring trenches 14 to form a barrier conductor film. Subsequently, a W film is deposited on the interlayer insulator 13 by the CVD so as to fill the wiring trenches 14 with the W film. Next, the unnecessary portions of the barrier conductor film and the W film on the interlayer insulator 13 are removed by the polishing by the CMP so as to leave the barrier conductor film and the W film in the wiring trenches 14. By doing so, the buried wirings 15D are formed. At this time, the over polishing is necessary in order to completely remove the barrier conductor film in the region outside the wiring trenches 14. Therefore, the W film to be buried in the wiring trench 14 with the relatively larger width is selectively polished in this over polishing process, and as a result, the recessed portion is formed at the central portion. Subsequently, after sequentially depositing the etching stopper film 16 and the insulator 17 identical to those of the first embodiment on the substrate 1, the insulator 17 and the etching stopper film 16 are etched using a photoresist film patterned by the photolithography technique as a mask. By doing so, the contact holes (trench portions) 18 are formed.

Figure 17:
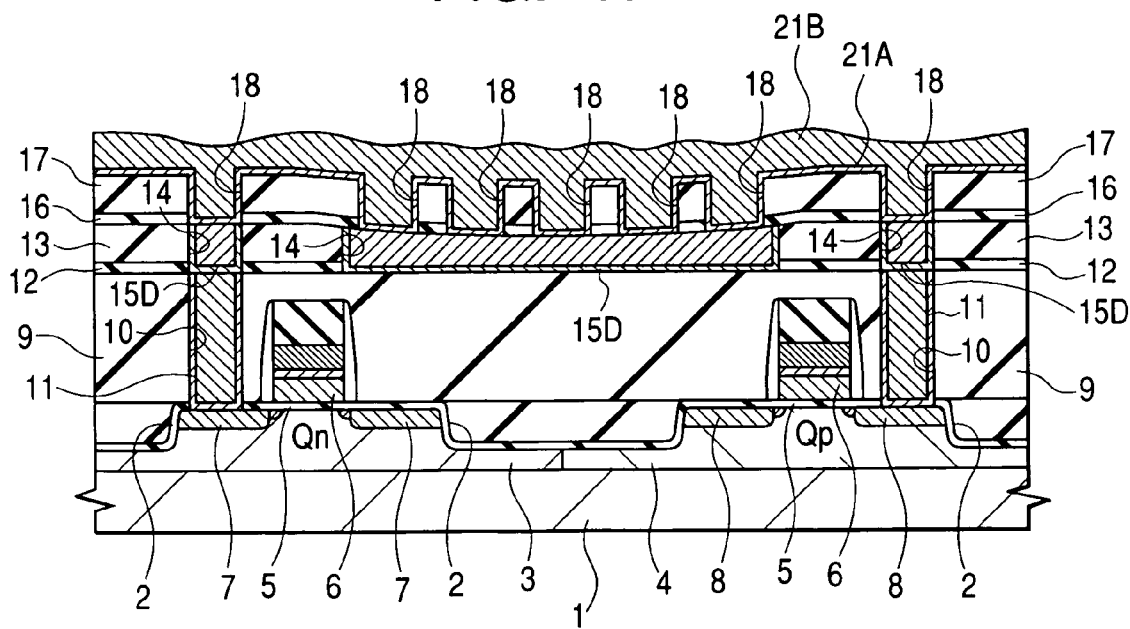
FIG. 17 is a sectional view showing the principal part of the semiconductor substrate in the manufacturing process of the semiconductor integrated circuit device subsequent to FIG. 16.

Next, as shown in FIG. 17, a Ti film and a titanium nitride film are sequentially deposited on the insulator 17 and in the contact holes 18, thereby forming the barrier conductor film (first conductive film) 21A. Subsequently, a W film is deposited on the insulator 17 by the CVD, thereby forming the conductive film (second conductive film) 21B to fill the contact holes 18.

Figure 18:
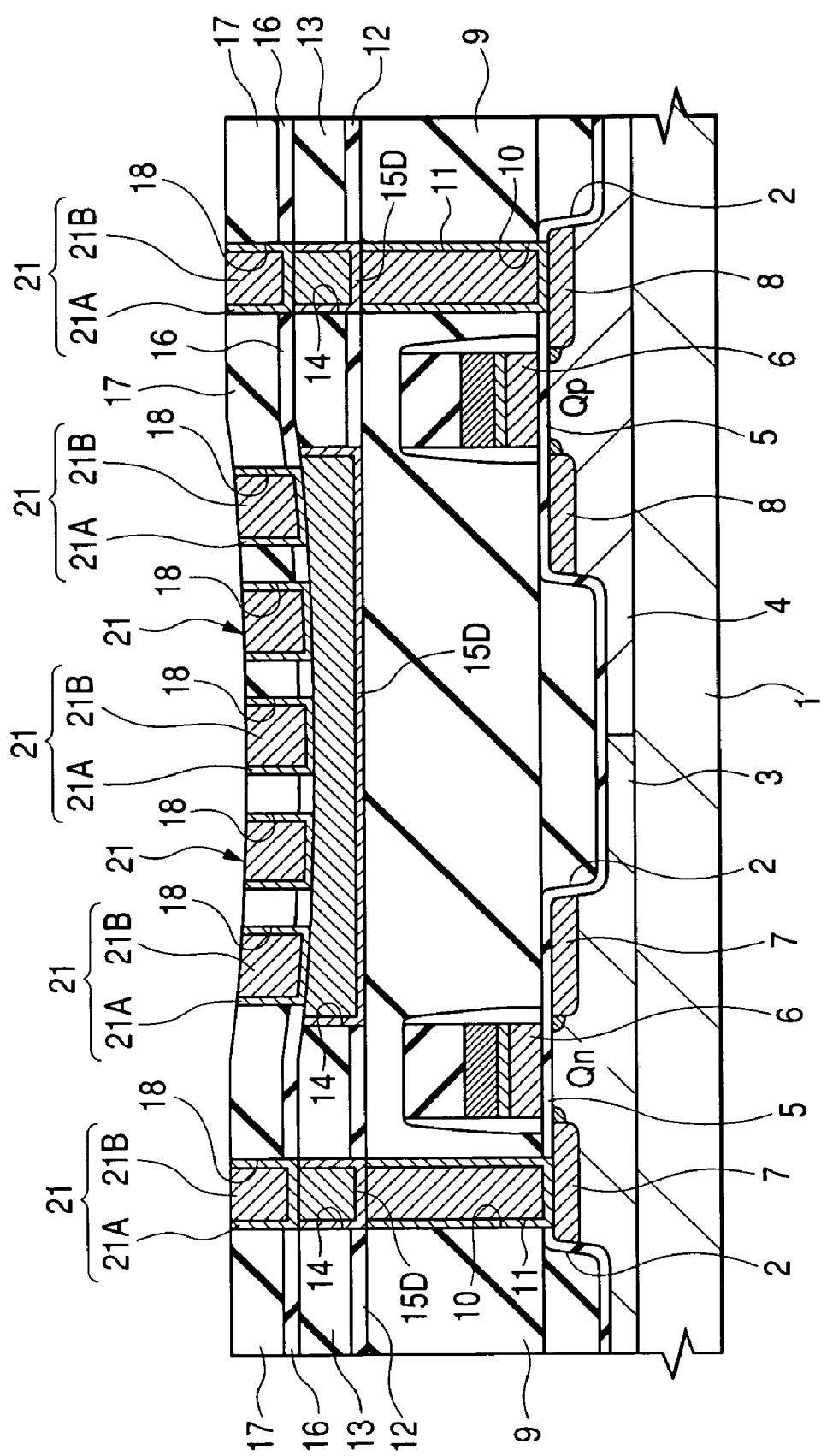
FIG. 18 is a sectional view showing the principal part of the semiconductor substrate in the manufacturing process of the semiconductor integrated circuit device subsequent to FIG. 17.

Next, as shown in FIG. 18, the unnecessary portions of the barrier conductor film 21A and conductive film 21B on the insulator 17 are removed by the polishing using the CMP so as to leave the barrier conductor film 21A and the conductive film 21B in the contact holes 18, thereby forming the plugs 21. For example, the slurry obtained by adding about 2 wt % of hydrogen peroxide to SSW2000 produced by the Cabot Microelectronics Corporation can be used in the polishing of the barrier conductor film 21A and the conductive film 21B.

Also in the case of forming the plugs 21 as described above, the conductive film 21B is selectively polished and recessed at the step of the over-polish, and further, the exposed insulator is also polished and the whole surface of the region where the contact holes 18 are densely formed is recessed. As a result, the thinning occurs. As a solution, the polishing pad used in the CMP process for forming the buried wirings 23 (see FIG. 8) described in the first embodiment is applied to the CMP process for forming the plugs 21 in this third embodiment. More specifically, the non-uniform polyurethane-foam pad used in the polishing of the barrier conductor film 23A (see FIG. 7) comprised of a Ta film is used in the polishing of the conductive film 21B and the barrier conductor film 21A. In this manner, the erosion of the insulator 17 between the plugs 21 can be made uniform. Therefore, even if the adjacent plugs 21 are formed close to each other, the thinning is not increased and can be controlled to a certain range. Also, similar to the buried wiring 23 in the first embodiment, under the polishing conditions according to the third embodiment, the thinning can be reduced in comparison to the case of using the uniform polyurethane-foam pad in the polishing of the barrier conductor film 21A. Therefore, it becomes possible to prevent the following problem. That is, when the buried wirings (including the plugs) are formed on the upper layer of the plugs 21, the surface of the upper insulator for forming the buried wirings is recessed due to the thinning of the underlying wiring layer in which the plugs 21 are formed, and the polishing residue of the conductive film in the CMP is left in the recessed portion, and as a result, the buried wirings in the upper layer are short-circuited.

After forming the plugs 21, the etching stopper film 19 and the insulator 20 similar to those in the first embodiment are deposited on the substrate 1 as shown in FIG. 19. Subsequently, the wiring trenches 22 reaching the plugs 21 are formed by the etching of the insulator 20 and the etching stopper film 19 using the photoresist film patterned by the photolithography technique as a mask. Thereafter, the buried wirings 23 electrically connected to the plugs 21 are formed in the same process as that for forming the buried wirings 23 (see FIG. 8) described in the first embodiment. By doing so, the semiconductor integrated circuit device according to the third embodiment is manufactured.

In the foregoing, the invention made by the inventor of the present invention has been concretely described based on the embodiments. However, the present invention is not limited to the foregoing embodiments and various modifications, and alterations can be made within the scope of the present invention.

For example, the CMP process for forming the buried wirings 23 (see FIG. 8) described in the first embodiment can be applied to the CMP process for forming the buried wirings 15 (see FIG. 8) below the buried wirings 23.

The effect obtained by the embodiments disclosed in this application will be briefly described as follows.

That is, since the reduction in height of the buried wirings due to the erosion can be prevented regardless of the line density, it is possible to form the buried wirings with a predetermined height.

What is claimed is:

1. A manufacturing method of a semiconductor integrated circuit device, comprising the steps of:
   (a) forming an insulator over a semiconductor substrate;
   (b) forming trenches by etching of said insulator;
   (c) forming a first conductive film on the surface of said insulator and in said trenches;
   (d) forming a second conductive film with a removal rate higher than that of said first conductive film on the surface of said first conductive film and in said trenches so as to fill said trenches;
   (e) chemically and mechanically polishing said second conductive film outside said trenches with use of a first polishing pad so as to leave said second conductive film in said trenches; and
   (f) chemically and mechanically polishing said first conductive film outside said trenches with use of a second polishing pad so as to leave said first conductive film in said trenches,
   wherein said first polishing pad and said second polishing pad include pores therein, and the diameter of said pores included in said second polishing pad is larger than that included in said first polishing pad.

2. The manufacturing method of a semiconductor integrated circuit device according to claim 1, wherein the diameter of said pores included in said second polishing pad is non-uniform.

3. The manufacturing method of a semiconductor integrated circuit device according to claim 2,
wherein the pores with a diameter of smaller than 150 µm and those with a diameter larger than 150 µm are both included in said second polishing pad.

4. The manufacturing method of a semiconductor integrated circuit device according to claim 3,
wherein said pores included in said second polishing pad have the diameter of 100 to 2000 µm.

5. The manufacturing method of a semiconductor integrated circuit device according to claim 3,
wherein such a polishing agent that the selectivity in removal rate of the said first conductive film to said insulator becomes 10 times or more, is used in said step (f).

6. The manufacturing method of a semiconductor integrated circuit device according to claim 1,
wherein said second conductive film mainly contains copper.

7. A manufacturing method of a semiconductor integrated circuit device, comprising the steps of:
(a) forming an insulator over a semiconductor substrate;
(b) forming trenches by etching of said insulator;
(c) forming a first conductive film on the surface of said insulator and in said trenches;
(d) forming a second conductive film with a removal rate higher than that of said first conductive film on the surface of said first conductive film and in said trenches so as to fill said trenches;
(e) chemically and mechanically polishing said second conductive film outside said trenches with use of a first polishing pad so as to leave said second conductive film in said trenches; and
(f) chemically and mechanically polishing said first conductive film outside said trenches with use of a second polishing pad so as to leave said first conductive film in said trenches,
wherein the density of said second polishing pad is lower than that of said first polishing pad.

8. The manufacturing method of a semiconductor integrated circuit device according to claim 7,
wherein the density of said second polishing pad is 0.4 to 0.6 g/cm$^3$, and said second polishing pad includes the pores with the diameter of 150 µm or larger.

9. The manufacturing method of a semiconductor integrated circuit device according to claim 8,
wherein said pores included in said second polishing pad have the diameter of 150 to 2000 µm.

10. The manufacturing method of a semiconductor integrated circuit device according to claim 7,
wherein said second conductive film mainly contains copper.

11. A manufacturing method of a semiconductor integrated circuit device, comprising the steps of:
(a) forming an insulator over a semiconductor substrate;
(b) forming trenches by etching of said insulator;
(c) forming a first conductive film on the surface of said insulator and in said trenches;
(d) forming a second conductive film with a removal rate higher than that of said first conductive film on the surface of said first conductive film and in said trenches so as to fill said trenches;
(e) chemically and mechanically polishing said second conductive film outside said trenches with use of a first polishing pad so as to leave said second conductive film in said trenches; and
(f) chemically and mechanically polishing said first conductive film outside said trenches with use of a second polishing pad so as to leave said first conductive film in said trenches,
wherein said second polishing pad has the hardness of 75 degrees or more measured by the type E durometer in conformity with the JIS K6253, and the density of said second polishing pad is 0.6 g/cm$^3$ or lower.

12. The manufacturing method of a semiconductor integrated circuit device according to claim 11,
wherein the density of said second polishing pad is 0.4 to 0.6 g/cm$^3$.

13. The manufacturing method of a semiconductor integrated circuit device according to claim 11,
wherein said second conductive film mainly contains copper.

14. A manufacturing method of a semiconductor integrated circuit device, comprising the steps of:
(a) forming an insulator over a semiconductor substrate;
(b) forming trenches by etching of said insulator;
(c) forming a first conductive film on the surface of said insulator and in said trenches;
(d) forming a second conductive film with a removal rate higher than that of said first conductive film on the surface of said first conductive film and in said trenches so as to fill said trenches;
(e) chemically and mechanically polishing said second conductive film outside said trenches with use of a first polishing pad so as to leave said second conductive film in said trenches; and
(f) chemically and mechanically polishing said first conductive film outside said trenches with use of a second polishing pad so as to leave said first conductive film in said trenches,
wherein said first polishing pad and said second polishing pad include pores; the pores with a diameter of 150 µm or smaller are included in said first polishing pad; and the pores with a diameter larger than 150 µm and those smaller than 150 µm are both included in said second polishing pad.

15. The manufacturing method of a semiconductor integrated circuit device according to claim 14,
wherein said pores included in said first polishing pad have the diameter of 10 to 150 µm and said pores included in said second polishing pad have the diameter of 110 to 2000 µm.

16. The manufacturing method of a semiconductor integrated circuit device according to claim 14,
wherein said second conductive film mainly contains copper.

* * * * *